(12) United States Patent
McLoughlin

(10) Patent No.: US 7,965,208 B2
(45) Date of Patent: Jun. 21, 2011

(54) AUTO RANGING SYSTEM AND METHOD FOR ANALOG SIGNAL

(75) Inventor: Robert F. McLoughlin, Pelham, NH (US)

(73) Assignee: Entegris, Inc., Billerica, MA (US)

( * ) Notice: Subject to any disclaimer, the term of this patent is extended or adjusted under 35 U.S.C. 154(b) by 0 days.

(21) Appl. No.: 12/377,108

(22) PCT Filed: Aug. 10, 2007

(86) PCT No.: PCT/US2007/017805
§ 371 (c)(1),
(2), (4) Date: Mar. 20, 2009

(87) PCT Pub. No.: WO2008/021241
PCT Pub. Date: Feb. 21, 2008

(65) Prior Publication Data
US 2009/0315745 A1    Dec. 24, 2009

Related U.S. Application Data

(60) Provisional application No. 60/837,051, filed on Aug. 11, 2006.

(51) Int. Cl.
*H03M 1/00* (2006.01)
(52) U.S. Cl. .......................................... 341/139; 330/9
(58) Field of Classification Search .......... 341/139–155; 330/9
See application file for complete search history.

(56) References Cited

U.S. PATENT DOCUMENTS

| 3,187,323 A | 6/1965 | Flood |
| 3,790,886 A | 2/1974 | Kurtin et al. |
| 3,958,178 A | 5/1976 | Mueller |
| 4,105,967 A | 8/1978 | Macemon |
| 4,305,063 A | 12/1981 | Hanson |
| 4,605,920 A | 8/1986 | Naisuler |
| 4,901,078 A | 2/1990 | Goyal |
| 5,170,166 A | 12/1992 | Tanaka et al. |
| 5,194,865 A | 3/1993 | Mason et al. |

(Continued)

FOREIGN PATENT DOCUMENTS
WO    WO 2008/021241 A2    2/2008

OTHER PUBLICATIONS

International Preliminary Report on Patentability mailed on Feb. 26, 2009 for PCT Application No. PCT/US2007/017805.

(Continued)

*Primary Examiner* — Lam T Mai
(74) *Attorney, Agent, or Firm* — Sprinkle IP Law Group

(57) ABSTRACT

Disclosed herein are embodiments of an auto ranging system and method for an analog signal. A microprocessor is configured to digitally control the programmable gains of an operational amplifier based on the digital output of an A/D converter which may reside on or packaged along with the microprocessor. The amplifier receives a raw analog signal from a sensor and provides an amplified analog signal to the A/D converter. The gain of the amplifier generally corresponds to some range of the sensor signal. The A/D converter outputs a number of bits representative of the input signal. A microprocessor which is configured to digitally control the programmable gains of the amplifier receives and examines the output from the A/D converter and automatically adjusts the gain of the amplifier accordingly and as needed to keep or maintain the output from the A/D converter in a predetermined range.

18 Claims, 3 Drawing Sheets

U.S. PATENT DOCUMENTS

| | | |
|---|---|---|
| 5,329,281 A | 7/1994 | Baumgartner et al. |
| 5,568,143 A | 10/1996 | Hutchison et al. |
| 5,844,512 A | 12/1998 | Gorin et al. |
| 6,140,948 A | 10/2000 | Yu |
| 6,288,664 B1 * | 9/2001 | Swanson ................. 341/155 |
| 6,329,938 B1 | 12/2001 | Saur et al. |
| 6,414,619 B1 | 7/2002 | Swanson |
| 6,448,914 B1 * | 9/2002 | Younis et al. ............ 341/141 |
| 6,573,783 B2 * | 6/2003 | Gray ........................ 330/9 |
| 6,590,517 B1 | 7/2003 | Swanson |
| 6,683,552 B2 | 1/2004 | Noll et al. |
| 6,757,018 B1 | 6/2004 | Fowler |
| 6,765,189 B1 | 7/2004 | Sahu et al. |
| 6,864,820 B2 | 3/2005 | Nakamura et al. |
| 6,940,445 B2 | 9/2005 | Kearney |
| 6,993,291 B2 | 1/2006 | Parssinen et al. |
| 7,345,530 B1 * | 3/2008 | Li et al. ..................... 330/9 |
| 2003/0102994 A1 | 6/2003 | Stimmann |
| 2005/0195448 A1 | 9/2005 | Llewellyn et al. |
| 2006/0077303 A1 | 4/2006 | Gudmundson et al. |

OTHER PUBLICATIONS

International Search Report and Written Opinion for PCT/US07/17805 mailed Apr. 17, 2008.

* cited by examiner

AUTO RANGING SYSTEM AND METHOD FOR ANALOG SIGNAL

CROSS-REFERENCE TO RELATED APPLICATIONS

This application claims priority from PCT/US07/17805, entitled "AUTO RANGING SYSTEM AND METHOD FOR AN ANALOG SIGNAL," filed Aug. 10, 2007, which in turn claims priority from U.S. Provisional Patent Application No. 60/837,051, entitled "AUTO RANGING SYSTEM AND METHOD FOR AN ANALOG SIGNAL," filed Aug. 11, 2006, by inventor Robert F. McLoughlin, both of which are hereby fully incorporated by reference herein for all purposes.

TECHNICAL FIELD OF THE INVENTION

Embodiments of the invention relate generally to electronics and sensors and more particularly to systems and methods for changing the gain of an input amplifier to an analog-to-digital ("A/D") converter.

BACKGROUND OF THE INVENTION

In many electronic systems, a sensor (e.g., a pressure sensor) outputs a signal having a voltage representative of a condition (e.g., a pressure). An amplifier multiplies the signal by a gain to create an input signal for the A/D converter. Prior systems typically adjust the gain of the input amplifier based on the analog signal input to the amplifier. For example, U.S. Pat. Nos. 3,187,323, 3,958,178, 4,105,967, 4,305,063, 4,605,920, and 6,288,664, describe systems in which the analog input signal is used in the gain selection circuit.

In many cases, external hardware/software components and/or additional circuitry may be required for various applications. For example, in U.S. Pat. No. 3,790,886, Kurtin et al. describe an A/D converter that utilizes mode switches, an active rectifier/polarity sensor, and a dual slope conversion to measure the magnitude of an unknown input voltage source.

In U.S. Pat. No. 4,901,078, Goyal describes an A/D converter that utilizes a differential method and circuitry so that the magnitude of the difference between the input and offset voltages fall in the input range of the A/D converter.

In U.S. Pat. No. 5,170,166, Tanaka et al. disclose a range switching device that uses two A/D converters for analog to digital conversion in which an analog signal from a photoelectric component is amplified by a switching amplifier. The amplified signal is forwarded to two A/D converters—a measuring A/D converter and a switching A/D converter. The switching A/D converter converts the analog signal to a digital signal. The digital signal from the switching A/D converter is compared with the upper and lower limits of the measuring A/D converter to determine the required amplification change for the switching amplifier.

In U.S. Pat. No. 5,194,865, Mason et al. disclose an A/D converter having an automatic range control. The converter of Mason et al. includes a level shifter for adjusting the magnitude of an analog signal into the A/D converter. The level shifter requires the use of a peak detector circuit for generating a reference potential corresponding to a peak amplitude of the analog signal to be converted.

In U.S. Pat. No. 5,329,281, Baumgartner et al. describe an PAD converter that utilizes an offset subtraction. Additional circuitry associated with the offset subtraction is required to implement the A/D converter of Baumgartner et al.

In U.S. Pat. No. 5,568,143, Hutchinson et al., disclose an analog to digital conversion system with an automatically and dynamically variable resolution range. In the system of Hutchinson et al., a microprocessor operates an A/D converter to sample an integrator output at successive increments of time. The digitized samples from the A/D converter are compared with a predetermined value in the upper end of the amplitude range of the A/D converter. Low amplitude analog signals do not reach the predetermined level until the later sampling times and thus are resolved at the upper end of the resolution range. Higher amplitude analog signals are resolved at the lower end of the resolution range. Thus, the resolution dynamically and automatically increases inversely with the amplitude of the analog signal being digitized. The digitized value is expressed by two binary numbers, one corresponding to the number of samples until detection of the sample of the integrator output achieving the predetermined amplitude, and the other corresponding to the value which the integrated signal has achieved.

In U.S. Pat. No. 5,844,512, Gorin et al. describes an autoranging device that utilizes a gain detector to set the gain of a variable operational amplifier prior to sending the op-amp output to the A/D converter. The device of Gorin et al. requires the gain detector and an amplifier gain setting rule processor in parallel with an anti-aliasing filter.

In U.S. Pat. No. 6,140,948, Yu describes an A/D converter system that uses two banks of capacitors. More specifically, a first bank of capacitors samples a reference voltage and a second bank of capacitors simultaneously samples a second input voltage. Thus, a reference voltage and two banks of capacitors are required to implement the A/D converter system of Yu.

In U.S. Pat. Nos. 6,414,619 and 6,590,517, Swanson describes an autoranging A/D converter that utilizes two inputs: an analog input and an estimate of the analog input. The autoranging A/D converter of Swanson also requires the use of an offset.

In U.S. Pat. No. 6,683,552, Noll et al. describe a converter system that requires the use of two A/D converters and a multiplexer. The converter system of Noll et al. requires merger of the corrected data from the two A/D converters.

In U.S. Pat. No. 6,864,820, Nakamura describes a method for extending the range of an A/D converter. The amount of overrange is determined using a special circuit and then compensated by offsetting. The method of Nakamura does not use a change in the gain of an operational amplifier.

In U.S. Pat. No. 6,940,445, Kearny describes a programmable input voltage range A/D converter. However, this programmable input range A/D converter does not control the output of an operational amplifier.

In U.S. Pat. No. 6,993,291, Parssinen et al. describe a method for controlling the range of an A/D converter. The control method of Parssinen et al. is not applicable to A/D converters of which the range is fixed.

In U.S. Patent Application Publication No. 2003/0102994, Stimmann describes a range converter that takes a signal source from a transducer and feeds it into an amplifier bank. In Stimmann, a bank of comparators is required to determine which channel in the amplifier bank is within the range of the A/D converter.

SUMMARY OF THE INVENTION

Conventional A/D converters, such as those which are typically packaged with microprocessors, cannot achieve the speed and performance of high-resolution A/D converters, which are typically integrated with external hardware and/or additional circuitry. However, conventional A/D converters are much cheaper and readily available. Thus, in some cases, it may be necessary and/or desirable to use conventional A/D converters and take advantage of the cost savings. One problem is that they may not provide enough resolution for some applications. For example, today's microprocessors have many peripherals on board, including A/D converters. However, the majority of the built-in A/D converters can only provide 8-10 bits resolution, which makes them inadequate for certain applications, particularly at the lower end of the scale. There is a need for a way to get better resolution at the lower end of the onboard type of A/D converters (or other limited bit A/D converters) and still take advantage of the cost savings. Embodiments of the invention can address this need and more.

Embodiments of the present invention provide an automatic ranging system and method that can increase the resolution of an analog system (e.g., an onboard A/D converter) without increasing the cost in hardware implementations.

More specifically, in embodiments of the invention, a microprocessor is configured to digitally control the programmable gains of an operational amplifier based on the number of bits output by an A/D converter. The gain generally corresponds to some range of the output signal by a sensor or transducer. The A/D converter may reside on or otherwise be packaged along with the microprocessor.

In an exemplary embodiment, an operational amplifier (e.g., a differential bridge amplifier with digitally programmable gain) receives an input from a sensor (e.g., a pressure sensor) and provides an output to an A/D converter (e.g., a 10-bit A/D converter). Based on the input signal, the A/D converter outputs a number of bits representative of the input signal (e.g., the pressure). A microprocessor (e.g., a single-chip 16/32-bit microcontroller) which is configured to digitally control the programmable gains of the operational amplifier receives and examines the output from the A/D converter and automatically adjusts the gain of the operational amplifier accordingly and as needed to keep or maintain the output from the A/D converter in a predetermined range (e.g., between 10% and 90% of full scale).

In some embodiments, if the microprocessor detects an output from the A/D converter outside of the range, it can repeat the last point, average one or more points, or use a variety of other software techniques, and adjust the gain of the programmable operational amplifier to bring the gain into a preferred A/D range.

For example, the microprocessor can be configured such that it will drop the gain of the input amplifier if the number of bits output by the A/D converter is greater than a predefined number and increase the gain if the number of bits is less than a predefined number. Using the example of a 10-bit A/D converter with 1023 output bits, if more than 1000 bits are output by the A/D converter, the gain of the amplifier is lowered. If less than 500 bits are output by the A/D converter, the gain is raised. If 500-1000 bits are output, the gain remains the same.

In some embodiments, the microprocessor can be configured to choose a gain that attempts to keep the output from the A/D converter in the top half of its range. In this way, the gains for the operational amplifier can be very precise. This is one advantage of the invention which can be further quantified. The precise control of the gains by the microprocessor makes calibration of the circuit optional.

Another advantage of the invention is that it eliminates the need for additional circuits and hardware components typically required for autoranging (e.g., comparator circuits, additional autoranging A/D converters, etc.). Yet another advantage of the invention is that the modification is mostly done on the processor. Thus, embodiments of the invention can be readily implemented and do not take up extra space.

Other objects and advantages of the present invention will become apparent to one skilled in the art upon reading and understanding the detailed description of the preferred embodiments described herein with reference to the following drawings.

BRIEF DESCRIPTION OF THE DRAWINGS

A more complete understanding of the present invention and the advantages thereof may be acquired by referring to the following description, taken in conjunction with the accompanying drawings in which like reference numbers indicate like features.

DETAILED DESCRIPTION OF THE INVENTION

Most of the microprocessors today come with A/D converters, most of which are 8- or 10-bit A/D converters. Without any modification, these built-in A/D converters have limited applications and are generally inadequate for higher resolution applications such as flow control in a pump system utilized in a semiconductor manufacturing process. In prior auto ranging systems, additional hardware is required for high resolution applications. Typically, the added hardware is external to the A/D converter. Embodiments of the invention disclosed herein can utilize a low cost A/D converter (e.g., one comes with the purchase of a single chip microcontroller) in a manner that allows it to perform better (e.g., increased resolution) with minimal or no additional hardware, thus providing significant savings in cost and physical space.

Unlike prior systems in which external comparator(s), A/D converter(s), feedback circuit(s), and/or sensor(s) are used to control signals coming into the analog side of an A/D converter, some embodiments of the invention are operable to utilize the digital output of a built-in A/D converter to affect the analog input thereof. In some embodiments of the invention, this is accomplished with a programmable gain amplifier capable of receiving digital inputs for changing the gain. For example, a differential input amplifier with a digitally controlled gain can be responsive to a digital input from a microprocessor to change the gain applied to an analog signal. Within this disclosure, the terms "microprocessor", "processor", and "microcontroller" are used interchangeable. The amplifier outputs to the microprocessor, which is configured to examine the output of the A/D converter and decrease or increase the gain of the amplifier accordingly. This can be a cost-effective and straightforward way to enable the A/D converter to provide a higher resolution than its default or factory capability.

Figure 1:
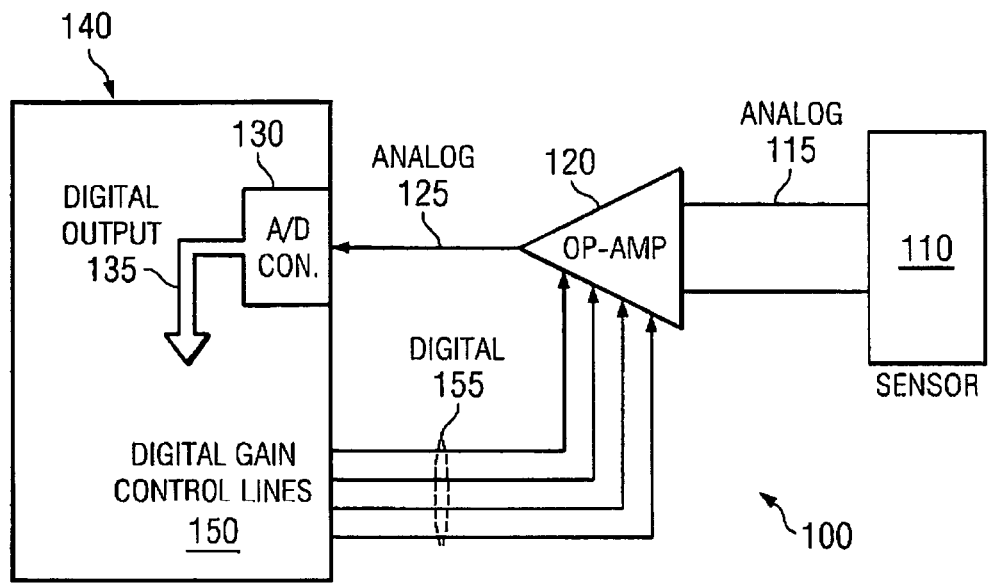
FIG. 1 is a schematic representation of an exemplary auto ranging system according to one embodiment of the invention.

FIG. 1 is a schematic representation of an auto ranging system 100 according to one exemplary embodiment of the invention. In this example, auto ranging system 100 comprises sensor 110, operational amplifier 120 (e.g., a differential amplifier) coupled to sensor 110 for amplifying analog signals 115 received from sensor 110, and A/D converter 130 coupled to amplifier 120 for converting amplified analog signals 125 to digital signals 135. A/D converter 130 can be built-in or otherwise packaged with microcontroller 140, which is capable of digitally controlling the gain of amplifier 120 via digital gain control lines 150 carrying digital output signals 155. As FIG. 1 exemplifies, embodiments of the invention utilize the digital output (e.g., digital output 135) of an onboard A/D converter (e.g., A/D converter 130) for comparisons. No external comparisons and no additional hardware (e.g., feed back circuits, comparators, etc.) are required to accomplish the correct gain setting.

In one embodiment, A/D converter 130 is a 10-bit A/D converter and sensor 110 is a pressure sensor (e.g., a strain gauge). In this example, sensor 110 operates in the range of 0-60 psi and amplifier 120 may have a gain that doubles with each number (e.g., 1, 2, 4, 8, 16, 32, and so on). In this case, 10-bit provides insufficient resolution at the lower end (e.g., 0-30 psi) of the full scale of sensor 110. Resolution can be seen as a percentage of the full scale, which can be seen as a percentage of reading. As sensor 110 reads pressure, a decision is made at microcontroller 140 to increase or decrease the gain or allow it to remain the same based on a digital output. For example, if the digital output of the A/D converter (e.g., digital output 135 of A/D converter 130) indicates that the analog input (e.g., analog signal 125) is greater than 90% of full scale, the gain can be reduced (e.g., via digital signals 155 and digital gain control lines 150). If, on the other hand, the digital output of the A/D converter indicates that the analog signal is at less than 45% of full scale, the gain can be raised.

Figure 2:
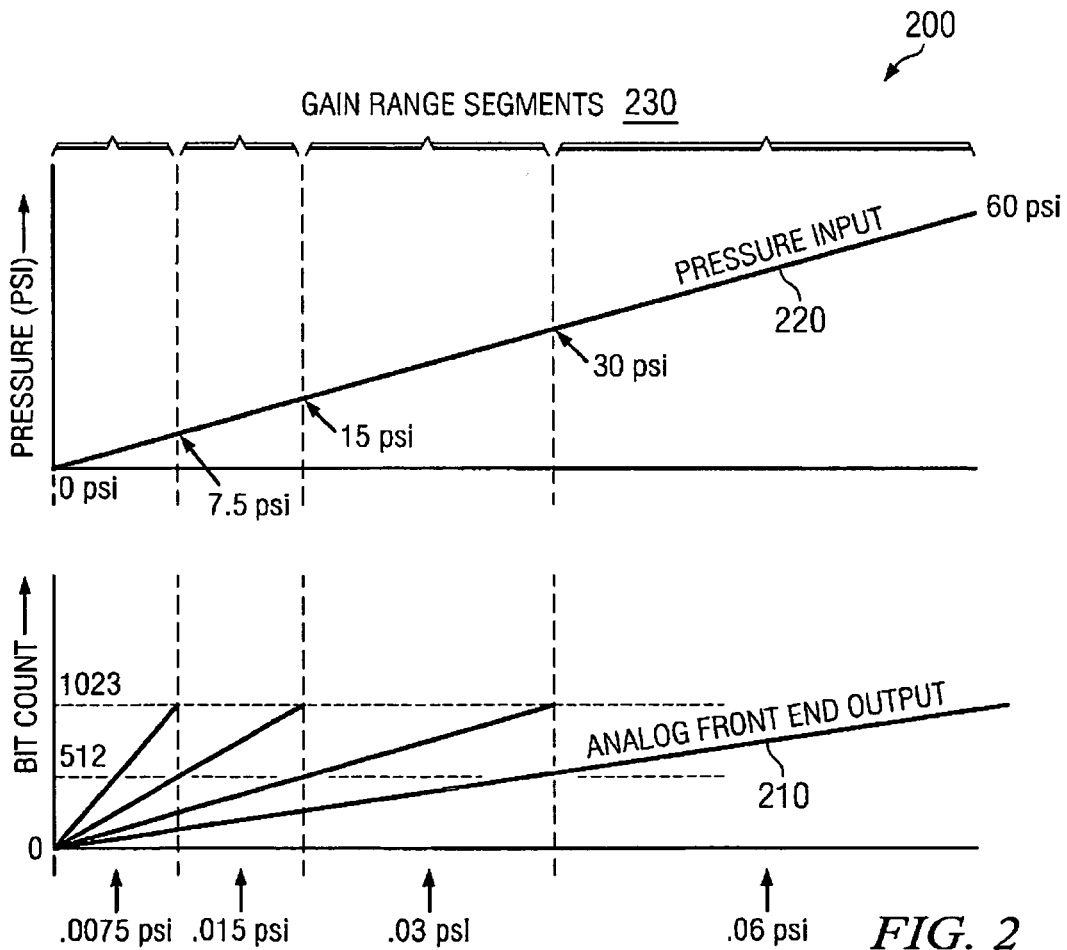
FIG. 2 is a schematic representation of an exemplary auto ranging function according to one embodiment of the invention.

FIG. 2 is a schematic representation of auto ranging function 200 of an auto ranging system implementing one embodiment of the invention. In this example, a 5-bar sensor and a 10-bit A/D converter are utilized. In applications that do not use the auto ranging function disclosed herein, the analog system may have a resolution of 60 psi/1023 bits or approximately 0.058 psi per bit. A full-scale analog system operates between 0-3.0 volts. This calculates to be 50 mv/psi. According to embodiments of the present invention, on the other hand, the full-scale range of the analog system (e.g., 0-60 psi) is divided into four segments (e.g., gain range segments 230). Each segment corresponds to a different gain setting.

In the example shown in FIG. 2, segments 230 comprise a first segment of 0-7.5 psi, a second segment of 7.5-15.0 psi, a third segment of 15-30 psi, and a fourth segment of >30 psi. The pressure input 220 is shown to increase from 0 psi to 60 psi. The analog front end output 210 can be seen in each segment.

In an auto ranging system implementing one embodiment of auto ranging function 200, in the first segment of 0-7.5 psi and 0-3 v, the analog resolution increases to 7.5 psi at 3 v or 0.4 volts per psi. At approximately one-tenth of a percent of the full scale system, this calculates to a resolution of 0.007 psi per bit. In other words, the entire pressure range of 0-7.5 psi is spread over the 0-3 v output of the amplifier and hence 0-1023 bit range of the A/D converter. Similarly, in the second segment of 7.5-15 psi and 0-3 v, the analog resolution increases to 15 psi at 3 v or 0.2 volts per psi (i.e., 0-15 psi is spread over 0-3 volts and correspondingly 0-1023 bits). The resulting resolution is about 0.014 psi. In the third segment of 15-30 psi and 0-3 v, the analog resolution increases to 30 psi at 3 v or 0.1 volts per psi (i.e., 0-30 psi is spread over 0-3 volts and correspondingly 0-1023 bits). The resulting resolution is about 0.03 psi. In the last segment of 30-60 psi and 0-3 v, the analog resolution increases to 60 psi at 3 v or 0.2 volts per psi (i.e., 0-60 psi is spread over 0-3 volts and correspondingly 0-1023 bits). The resulting resolution is about 0.058 psi.

In some embodiments, auto ranging function 200 can be realized via an automatic ranging algorithm/gain selection routine embodied in software code. An exemplary code snippet is provided as follows:

```
if(raw_ad_output/AD_FULLSCALE_COUNT)
{
    if(currentAnalogGain > min_gain) currentAnalogGain--;
}
else if((raw_ad_output * gain_multiplier) <
AD_FULLSCALE_COUNT)
{
    if(currentAnalogGain < max_gain) currentAnalogGain++;
}
```

In some embodiments, the software code comprises computer program instructions which can be stored on one or more computer readable media and executable by a processor. The term "computer-readable media" encompasses all types of data storage media that can be accessed and read by a computer. Examples of computer-readable media include computer memories such as read-only memory (ROM), random access memory (RAM), flash memory, and data storage devices such as floppy disks, disk drives, compact-disc ROM, tape drives, data cartridges, optical disks, etc. Microcontrollers that can be programmed to implement embodiments of the invention generally include on-chip memories on which the special software code embodying the automatic ranging algorithm/gain selection routine can be stored.

Figure 3:
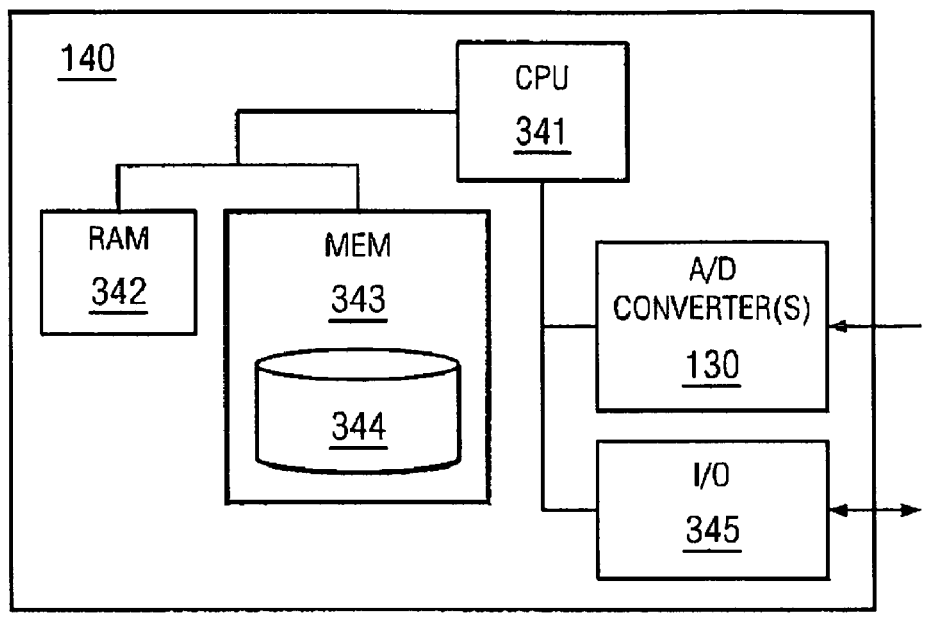
FIG. 3 is a simplified block diagram of an exemplary microcontroller implementing one embodiment of the invention.

FIG. 3 is a simplified block diagram of exemplary microcontroller 140 implementing one embodiment of auto ranging function 200. In this example, microcontroller 140 comprises central processing unit (CPU) 341, RAM 342, MEM 343, A/D converter 130, and I/O 345. In one embodiment, microcontroller 140 is a single chip microcontroller with an onboard A/D converter. In one embodiment, A/D converter 130 is a 10-bit A/D converter. In one embodiment, MEM 343 is a high speed Flash memory carrying auto ranging software 344. In one embodiment, microcontroller 140 is a single chip microcontroller with an onboard 10-bit A/D converter from Philips (Model No. LPC2136). As one skilled in the art can appreciate, other commercially available microcontrollers can also be readily adapted to implement embodiments of the invention disclosed herein. Computer programming languages and techniques necessary to program microcontroller 140 with auto ranging software 344 are known to those skilled in the art.

In embodiments of the invention, a microcontroller reads the output from an A/D converter internally and determines the correct gain according to the auto ranging software code. More specifically, in one embodiment, a microcontroller implemented with the auto ranging function described herein can determine when the gain should change and in what direction. In one embodiment, this can be determined by setting a maximum bit count for the digital output of a built-in A/D converter. Following the above example in which a 10-bit A/D converter is utilized, the full-scale digital output would be 1023 counts.

To provide a buffer zone, the auto ranging or gain switch software sets the maximum count at 1000 according to one embodiment of the invention. This number is configurable and can be readily adapted to suit as it simply provides an area for the analog signal to be valid prior to the gain selection routine correcting the input gain. Following the analog-to-digital conversion, the microcontroller examines internally the digital output of the A/D converter and determines if it is above the maximum count. If it is, the microcontroller operates to reduce the gain of the upstream operational amplifier to the next lower gain setting. If it is not above the maximum count, the microcontroller executing the gain selection routine can determine if the output of the A/D converter at the next higher gain is less than the maximum count. If so, the microcontroller operates to increase the gain to the next higher setting. If none of these conditions are true, the gain will stay the same.

In another embodiment, a microcontroller implemented with the auto ranging function described herein can set upper and lower thresholds (e.g., 500 and 1000 counts). These points are chosen so that any increase or decrease in the gain which may double in each step will not put the reading out of the range of the A/D converter or reduce the gain beyond the required resolution. For example, if the output of a 10-bit A/D converter is 490, the gain can be increased to the next higher setting. If the output of the A/D converter is 1009, on the other hand, the gain can be decreased. If the output of the A/D converter is between 500-1000 bits, the gain can remain the same.

Embodiments of the invention can provide many advantages. For example, in embodiments of the invention when the bit count of the digital output signal increases above a certain amount, the gain can be lowered, thereby lowering a subsequent bit count for the same pressure. If, on the other hand, the bit count of the output digital signal falls below a certain threshold, the gain can be increased, thereby increasing the bit count and the resolution for the same pressure reading. The precise control of the gains by the microprocessor makes calibration of the circuit optional. Furthermore, embodiments of the invention can increase resolution of onboard A/D converters without increasing cost, taking up physical space, or requiring external hardware such as comparators, feedback circuits, and/or additional A/D converters.

Figure 4:
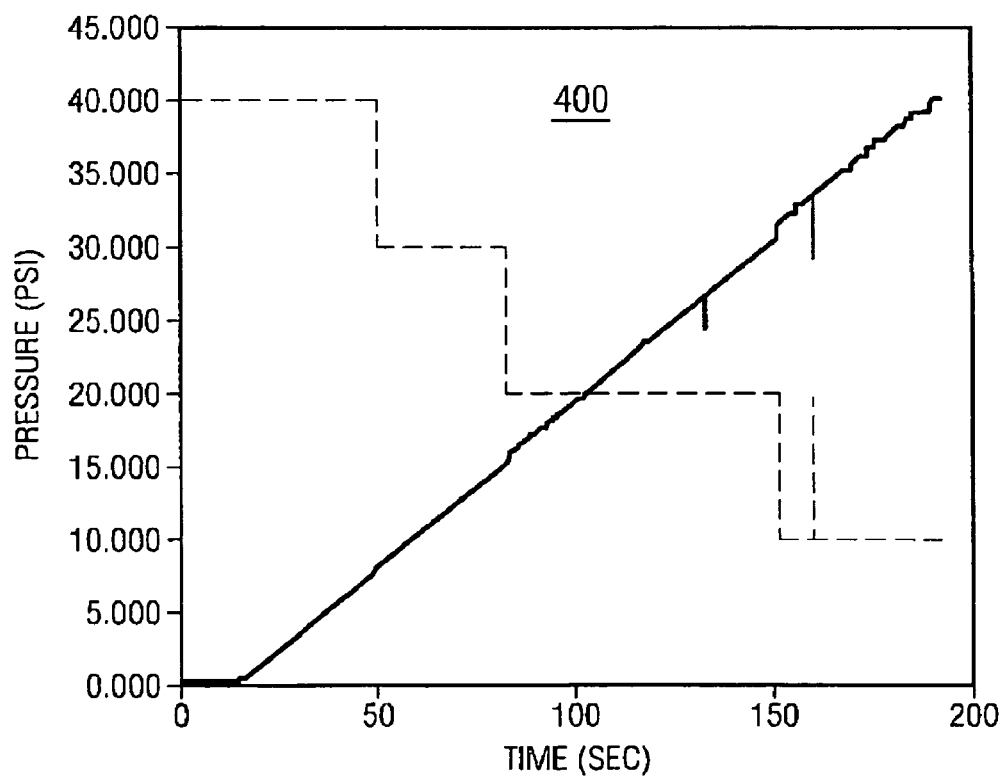
FIG. 4 is a plot diagram depicting one example of pressure output without gain correction.
Figure 5:
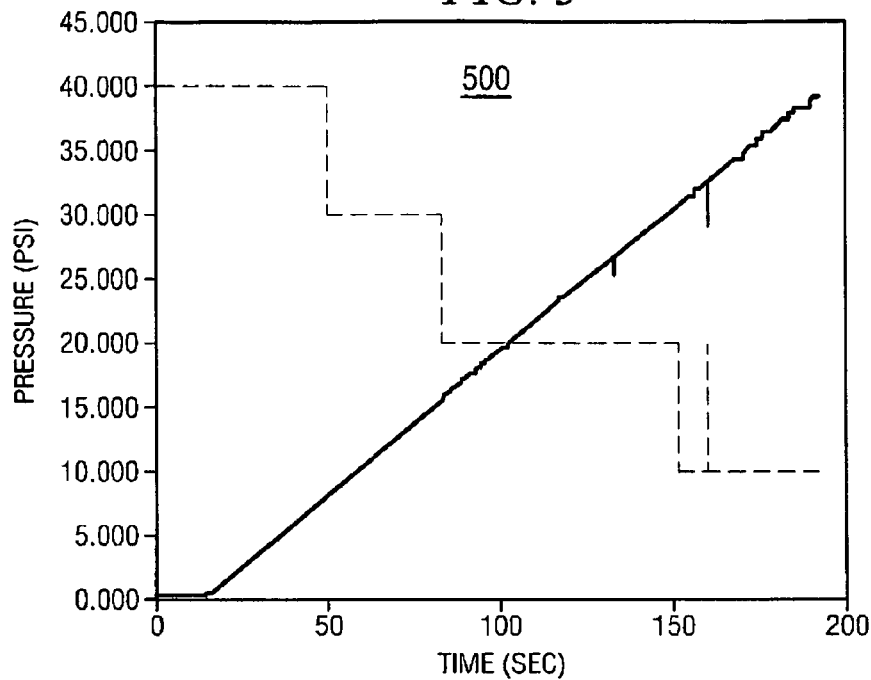
FIG. 5 is a plot diagram depicting one example of pressure output with gain correction.
Figure 6:
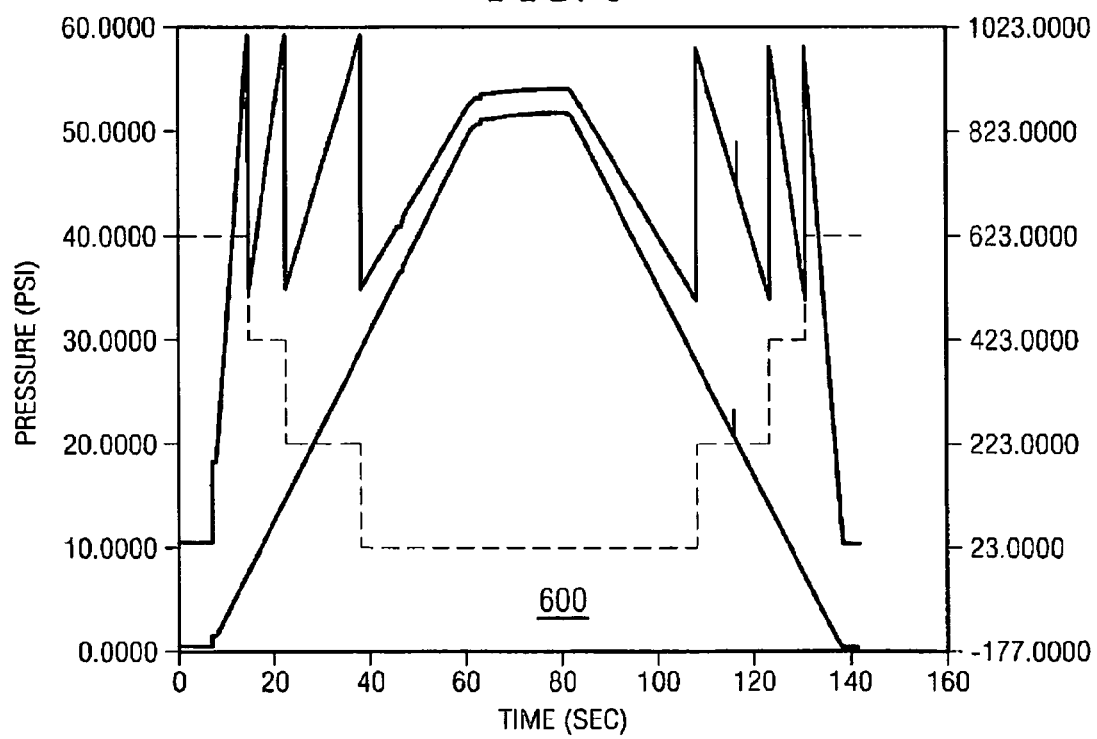
FIG. 6 is a plot diagram depicting one example of analog auto gain and raw A/D digital output.

FIG. 4 is a plot diagram depicting one example of pressure output without gain correction. FIG. 5 is a plot diagram depicting one example of pressure output with gain correction utilizing one embodiment of auto ranging system 100 which implements auto ranging function 200 described herein. FIG. 6 is a plot diagram depicting one example of analog auto gain (unfiltered) and raw A/D digital output. In this example, the pressure input is supplied by a Druke pressure controller ramp set to 1 psi/sec.

In embodiments of the invention, the gain changes based on, not the analog signal, but the digital output of the A/D converter. What is more, both the microcontroller and the A/D converter are downstream from the amplifier. Thus, embodiments of the invention can be independent of the type of amplifier and/or the resolution of the A/D converter. This means that embodiments of the auto ranging system and method disclosed herein can implement 8-, 12-, 16-bit A/D converters as well as A/D converters with 0-10, 0-5, +1-5 or any analog input configuration. In one embodiment, amplifier 120 is a differential input amplifier made by Linear Technology (Model NO. LTC6916).

One skilled in the art will recognize that embodiments of the invention can be readily adapted for various applications. For example, some embodiments of the invention can be particularly useful in reading pressure (e.g., via a strain gauge in a flow controller). One skilled in the art can also appreciate that embodiments of the invention may be implemented in various ways without departing from the scope and spirit of the invention. For example, as the gain of the amplifier is increased, the amount of noise is also increased. Thus, in some embodiments, an internal digital filter can be used to filter out high frequency noise. Various noise filtering schemes (e.g., using weighted average, etc.) may be utilized as known to those in the art. Additionally, the automatic ranging algorithm may include a system time to give the auto ranging system some time to settle before the microcontroller thus programmed reads again. If overranging occurs in a cycle, it can be filtered out as known to those skilled in the art.

Although the present invention has been described in detail herein with reference to the illustrative embodiments, it should be understood that the description is by way of example only and is not to be construed in a limiting sense. It is to be further understood, therefore, that numerous changes in the details of the embodiments of this invention and additional embodiments of this invention will be apparent to, and may be made by, persons of ordinary skill in the art having reference to this description. It is contemplated that all such changes and additional embodiments are within the scope of this invention. Accordingly, the scope of the invention should be determined by the following claims and their legal equivalents.

What is claimed is:

1. A method comprising:
   determining a total bit count representative of a full-scale output capability of an analog-to-digital converter;
   setting a first threshold and a second threshold representatives of a predetermined range of said full-scale output capability of said analog-to-digital converter, wherein said first threshold is less than said total bit count and said second threshold is less than said first threshold;
   receiving at said analog-to-digital converter an amplified analog signal from an operational amplifier with a programmable gain;
   converting said amplified analog signal into a digital signal;
   examining said digital signal, wherein said examining said digital signal comprises comparing a first bit count contained in said digital signal with said first threshold and said second threshold; and
   digitally adjusting said programmable gain of said operational amplifier to keep said digital signal in said predetermined range of said full-scale output capability of said analog-to-digital converter.

2. The method of claim 1, wherein said amplified analog signal is indicative of a sensor reading.

3. The method of claim 1, wherein examining said digital signal further comprises:
   determining whether said first bit count contained in said digital signal is above a maximum bit count, wherein said maximum bit count is less than said total bit count representative of said full-scale output capability of said analog-to-digital converter.

4. The method of claim 3, further comprising digitally reducing said programmable gain of said operational amplifier to a lower gain setting if said first bit count is above said maximum bit count.

5. The method of claim 3, further comprising digitally increasing said programmable gain of said operational amplifier to a higher setting if said first bit count is less than said maximum bit count.

6. The method of claim 1, further comprising:
   digitally reducing said programmable gain of said operational amplifier if said first bit count is higher than said first threshold.

7. The method of claim 1, further comprising:
digitally increasing said programmable gain of said operational amplifier if said first bit count is lower than said second threshold.

8. An apparatus comprising:
an analog-to-digital converter for receiving an amplified analog signal from an operational amplifier with a programmable gain and converting said amplified analog signal into a digital signal;
a central processing unit; and
a memory coupled to said central processing unit and storing computer-executable program instructions implementing an auto ranging algorithm operable to cause said central processing unit to:
examine said digital signal internally;
compare a first bit count contained in said digital signal with a first threshold and a second threshold, wherein said first threshold and said second threshold are representatives of a predetermined range of a full-scale digital output capability of said analog-to-digital converter, wherein said second threshold is less than said first threshold, and wherein said first threshold is less than a total bit count representative of said full-scale digital output capability of said analog-to-digital converter; and
digitally control said programmable gain of said operational amplifier based on said digital signal of said analog-to-digital converter to keep output of said analog-to-digital converter in said predetermined range.

9. The apparatus of claim 8, wherein said predetermined range encompasses top half of said full-scale output capability of said analog-to-digital converter.

10. The apparatus of claim 8, wherein said computer-executable program instructions implementing said auto ranging algorithm are further operable to cause said central processing unit to determine whether said first bit count contained in said digital signal is above a maximum bit count, wherein said maximum bit count is less than said total bit count representative of said full-scale output capability of said analog-to-digital converter.

11. The apparatus of claim 10, wherein said computer-executable program instructions implementing said auto ranging algorithm are further operable to cause said central processing unit to digitally reduce said programmable gain of said operational amplifier to a lower gain setting if said first bit count is above said maximum bit count.

12. The apparatus of claim 10, wherein said computer-executable program instructions implementing said auto ranging algorithm are further operable to cause said central processing unit to digitally increase said programmable gain of said operational amplifier to a higher gain setting if said first bit count is less than said maximum bit count.

13. The apparatus of claim 8, wherein said computer-executable program instructions implementing said auto ranging algorithm are further operable to cause said central processing unit to digitally reduce said programmable gain of said operational amplifier if said first bit count is higher than said first threshold.

14. The apparatus of claim 8, wherein said computer-executable program instructions implementing said auto ranging algorithm are further operable to cause said central processing unit to digitally increase said programmable gain of said operational amplifier if said first bit count is lower than said second threshold.

15. A system comprising:
an operational amplifier with a programmable gain for amplifying analog signals from a pressure sensor;
an analog-to-digital converter coupled to said operational amplifier for receiving an amplified analog signal from said operational amplifier and converting said amplified analog signal into a digital signal; and
a microcontroller operable to:
examine said digital signal;
determine whether a first bit count contained in said digital signal is above a maximum bit count, wherein said maximum bit count is less than a total bit count representative of a full-scale output capability of said analog-to-digital converter;
reduce said programmable gain of said operational amplifier to a lower gain setting if said first bit count is above said maximum bit count; and
increase said programmable gain of said operational amplifier to a higher setting if said first bit count is less than said maximum bit count.

16. The system of claim 15, wherein said microcontroller is further operable to determine whether said programmable gain of said operational amplifier is to be maintained or changed from a first gain setting to a second gain setting based on said digital signal from said analog-to-digital converter.

17. A system comprising:
an operational amplifier with a programmable gain for amplifying analog signals from a pressure sensor;
an analog-to-digital converter coupled to said operational amplifier for receiving an amplified analog signal from said operational amplifier and converting said amplified analog signal into a digital signal; and
a microcontroller operable to:
compare a first bit count contained in said digital signal with a first threshold and a second threshold, wherein said first threshold and said second threshold are representatives of a range of a full-scale digital output capability of said analog-to-digital converter, wherein said second threshold is less than said first threshold, and wherein said first threshold is less than a total bit count representative of said full-scale digital output capability of said analog-to-digital converter;
digitally control said programmable gain of said operational amplifier to keep output of said analog-to-digital converter in said range by:
reducing said programmable gain of said operational amplifier if said first bit count is higher than said first threshold; and
increasing said programmable gain of said operational amplifier if said first bit count is lower than said second threshold.

18. The system of claim 17, wherein said microcontroller is further operable to determine whether said programmable gain of said operational amplifier is to be maintained or changed from a first gain setting to a second gain setting based on said digital signal from said analog-to-digital converter.

* * * * *